US012672557B2

(12) United States Patent
Chen et al.

(10) Patent No.: US 12,672,557 B2
(45) Date of Patent: Jun. 30, 2026

(54) CHIP HIGH-DENSITY INTERCONNECTION PACKAGE STRUCTURE AND MANUFACTURING METHOD THEREOF

(71) Applicant: Zhuhai ACCESS Semiconductor Co., Ltd, Guangdong (CN)

(72) Inventors: Xianming Chen, Guangdong (CN); Yejie Hong, Guangdong (CN); Gao Huang, Guangdong (CN); Benxia Huang, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 357 days.

(21) Appl. No.: 18/221,510

(22) Filed: Jul. 13, 2023

(65) Prior Publication Data

US 2024/0096836 A1     Mar. 21, 2024

(30) Foreign Application Priority Data

Sep. 14, 2022    (CN) .......................... 202211125146.X

(51) Int. Cl.
| | |
|---|---|
| *H10W 70/60* | (2026.01) |
| *H10W 70/63* | (2026.01) |
| *H10W 70/65* | (2026.01) |
| *H10W 70/09* | (2026.01) |
| *H10W 70/652* | (2026.01) |
| *H10W 90/00* | (2026.01) |

(52) U.S. Cl.
CPC .......... *H10W 70/60* (2026.01); *H10W 70/611* (2026.01); *H10W 70/635* (2026.01); *H10W 70/65* (2026.01); *H10W 70/09* (2026.01); *H10W 70/6528* (2026.01); *H10W 90/00* (2026.01)

(58) Field of Classification Search
CPC . H01L 24/20; H01L 23/5381; H01L 23/5384; H01L 23/5386; H01L 24/19; H01L 2224/19; H01L 2224/24155; H01L 2224/244; H01L 2924/37
See application file for complete search history.

(56) References Cited

U.S. PATENT DOCUMENTS

| | | | |
|---|---|---|---|
| 2019/0006315 A1* | 1/2019 | Hsu | ..................... H01L 21/6835 |
| 2021/0202395 A1* | 7/2021 | Lu | ........................... H01L 24/13 |
| 2021/0305162 A1* | 9/2021 | Ganesan | ............. H01L 21/6835 |
| 2023/0317619 A1* | 10/2023 | Mahajan | ............. H01L 23/5381 |
| | | | 257/776 |
| 2024/0079334 A1* | 3/2024 | Ecton | ................ H01L 23/49822 |

* cited by examiner

*Primary Examiner* — Jacob Y Choi
*Assistant Examiner* — Neil R Prasad
(74) *Attorney, Agent, or Firm* — The PL Law Group, PLLC

(57) ABSTRACT

A chip high-density interconnection package structure includes a plate having a groove and a glass frame, a first via post penetrating the glass frame, a second via post penetrating the groove, a first line layer and a second line layer on the glass frame and electrically connected via the first via post, a third line layer and a fourth line layer on the groove and electrically connected via the second via post, a chip connection bridge on the third line layer in the groove, and a fifth line layer on the first line layer, and chips on the second line layer and the fourth line layer. The chip connection bridge has a first pad connected to the third line layer, the terminals of the two chips are connected to the fourth line layer and/or the second line layer, and the fifth line layer is connected to the first line layer.

12 Claims, 6 Drawing Sheets

CHIP HIGH-DENSITY INTERCONNECTION PACKAGE STRUCTURE AND MANUFACTURING METHOD THEREOF

CROSS-REFERENCE TO RELATED APPLICATION AND CLAIM OF PRIORITY

This application claims the benefit under 35 USC § 119 of Chinese Patent Application No. 202211125146X, filed on Sep. 14, 2022, in the China Intellectual Property Office, the entire disclosure of which is incorporated herein by reference for all purposes.

BACKGROUND

1. Technical Field

The present application relates to the field of semiconductor encapsulation technology, and more particularly to a chip high-density interconnection package structure and a method for manufacturing the same.

2. Background Art

With the development of electronic technology, the performance requirements of electronic products are higher and higher, which makes the circuit of electronic devices and circuit boards more and more complex; at the same time, the size requirements of electronic products are becoming smaller and thinner, so that the high-density integration, miniaturization and multifunction of electronic components such as chips, package substrates, and package structures are the inevitable trends. As the chip line width and line spacing become smaller, it is more and more difficult to continue to miniaturize the chip; at the same time, in order to achieve high-density integration, miniaturization, multifunction, more and more complex wiring of the package substrate, the requirements of more layers and finer wiring are put forward. In order to meet higher electronic product performance, a plurality of chip-integrated packages can be realized, and in order to realize miniaturization of the multi-chip integrated packages, it is a trend to realize the interconnection between the plurality of chips.

In the related art, there are many ways to realize multi-chip interconnection, wherein a typical way is to provide a TSV intermediate layer between a carrier plate and a chip, for example, 2.5D encapsulation, use the TSV intermediate layer to realize chip-to-chip interconnection, and the chip-to-package carrier plate interconnection.

However, in the related art, on the one hand, the TSV intermediate layer significantly increases the cost of chip interconnection, and at the same time, the thick thickness of the TSV intermediate layer increases the volume of the packaged module, which cannot really realize that the packaged module is short and thin. On the other hand, the design freedom of the TSV intermediate layer to realize multi-chip interconnection is low, and the 2.5D package structure chip is attached to the surface of the TSV intermediate layer, and the intermediate layer and the package carrier plate are welded to realize interconnection, and the integration degree is relatively low.

SUMMARY

In view of the above, the object of the present application is to provide a chip high-density interconnection package structure and a method for manufacturing the same.

In a first aspect, the present application provides a chip high-density interconnection package structure, including a glass carrier plate having a groove and a glass frame surrounding the groove, a first via post penetrating the glass frame, a second via post penetrating the groove, a first line layer and a second line layer formed on the upper and lower surfaces of the glass frame and electrically connected via the first via post, a third line layer and a fourth line layer formed on the upper and lower surfaces of the groove and electrically connected via the second via post, a chip connection bridge mounted on the third line layer in the groove, and a fifth line layer formed on the first line layer, and at least two chips mounted on the second line layer and the fourth line layer; wherein the chip connection bridge has a first pad and the first pad is connected to the third line layer, the terminals of the two chips are each connected to the fourth line layer and/or the second line layer, and the fifth line layer is connected to the first line layer.

In a second aspect, the present application provides a method for manufacturing a chip high-density interconnection package structure, including:

locally etching a glass carrier plate to form a groove and a glass frame surrounding the groove, and forming a first via and a second via penetrating in a height direction on the glass frame and the groove;

metalizing the glass carrier plate, forming a first line layer and a second line layer on the upper and lower surfaces of the glass frame, forming a third line layer and a fourth line layer on the upper and lower surfaces of the groove, filling the first via to form a first via post, filling the second via to form a second via post, so that the first via post is conductively connected to the first line layer and the second line layer, and the second via post is conductively connected to the third line layer and the fourth line layer;

attaching a chip connection bridge in the groove so that a first pad of the chip connection bridge is connected to the third line layer;

laminating an encapsulation layer so that the encapsulation layer covers the first line layer and the chip connection bridge;

forming a fifth line layer on the encapsulation layer so that the first line layer is connected to the fifth line layer;

forming an insulating layer on the fifth line layer, and forming a sixth line layer on the insulating layer, so that the fifth line layer is connected to the sixth line layer;

flip-mounting at least two chips on the second line layer and the fourth line layer, wherein the at least two chips include a first chip and a second chip, wherein terminals of the first chip and the second chip are connected to a part of the second line layer and a part of the fourth line layer, respectively, so that the chip connection bridge functions to connect the first chip and the second chip.

The high-density interconnection encapsulation structure and the method for manufacturing same provided in the present application have the following beneficial effects: multi-chip interconnects are implemented using chip connection bridges embedded in a glass carrier plate, which significantly reduces the volume of the overall package structure compared to the TSV interposer. The chip can be flexibly connected to the chip connection bridge and the solder ball by the first and second via posts, and the degree of design freedom is high. The thermal expansion coefficient of the glass material used as the carrier plate is close to that of the silicon wafer so that the reliability of the multi-chip package is high; at the same time, the glass carrier plate can form tiny and high-density vias, which can meet the high-density I/O requirements of chip connection bridge.

BRIEF DESCRIPTION OF THE DRAWINGS

In order to explain the technical solution of the present application or the related art more clearly, the following will briefly introduce the drawings which are used in the description of the embodiments or the related art; obviously, the drawings in the description below are merely embodiments of the present application, and it would have been obvious for a person of ordinary skill in the art to obtain other drawings according to these drawings without involving any inventive effort.

DETAILED DESCRIPTION OF THE EMBODIMENTS

The objects, technical solutions, and advantages of the present application will become more apparent from the following detailed description when taken in conjunction with the accompanying drawings.

It should be noted that unless otherwise defined, technical or scientific terms used in the examples of this application shall have the ordinary meaning as understood by one of ordinary skill in the art to which this application belongs. The use of the terms "first", "second", and the like in the embodiments herein does not denote any order, quantity, or importance, but rather is used to distinguish one element from another. The word "comprise" or "include", and the like means that the elements or items preceding the word encompass the elements or items listed after the word and equivalents thereof, but do not exclude other elements or items. The word "connect" or "interconnect" and like terms are not limited to physical or mechanical connections but may include electrical connections, whether direct or indirect. "Up", "down", "left", "right", etc. are only used to indicate a relative positional relationship, which may change accordingly when the absolute position of the object being described changes.

Figure 1:
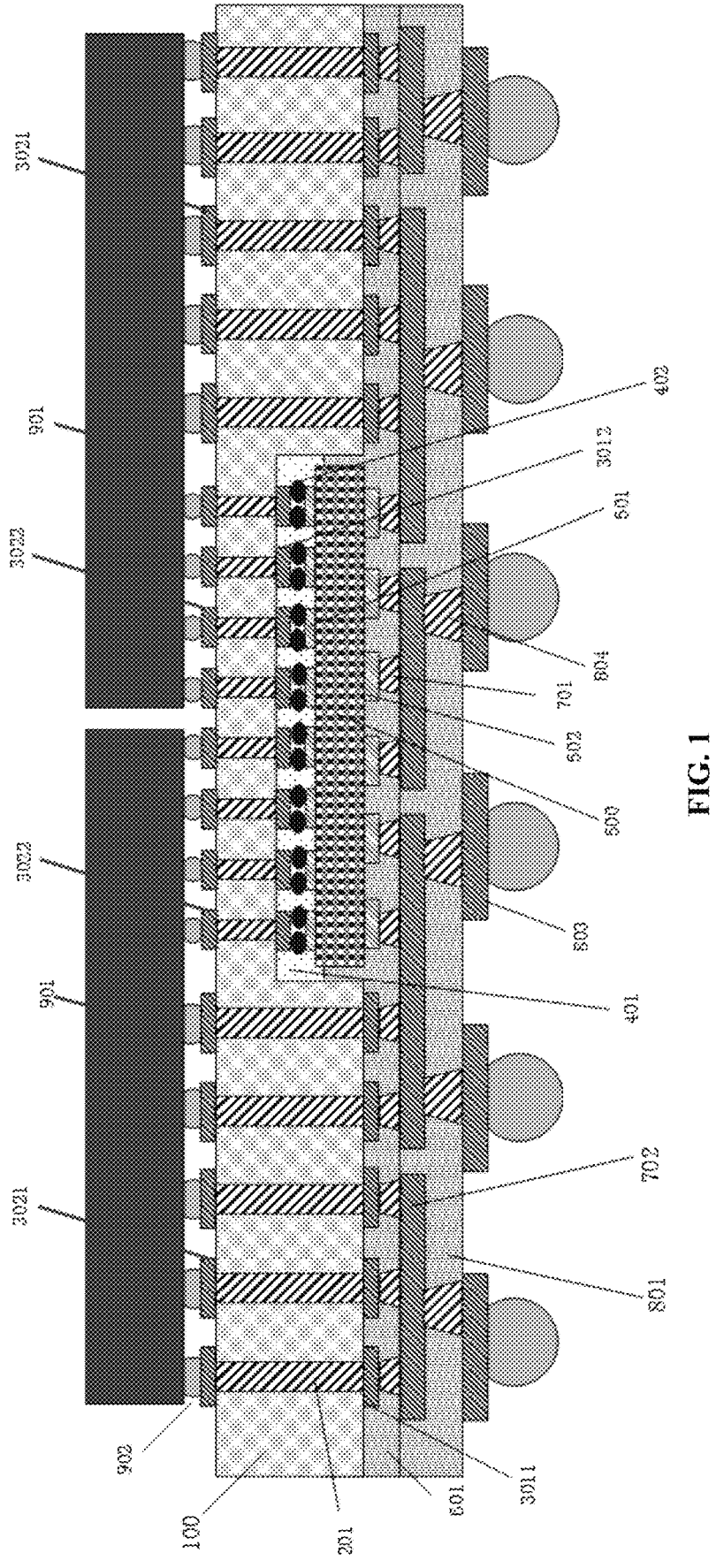
FIG. 1 is a schematic diagram of a chip high-density interconnection package structure according to an embodiment of the present application.

Referring to FIG. 1, there is shown a chip high-density interconnection package structure including a glass carrier plate having a coefficient of thermal expansion close to that of a silicon wafer, on which chip packaging can be performed to achieve higher reliability, while the ability of the glass carrier plate to form a high-density fine via can well satisfy high-density I/O requirements.

In one embodiment, the package structure includes a glass carrier plate including a groove 103 and a glass frame 100 surrounding the groove, a first via post 201 penetrating the glass frame 100, and a second via post 202 penetrating the groove 103.

The package structure further includes a first line layer 3011 and a second line layer 3021 formed on the upper and lower surfaces of the glass frame 100 and electrically connected through the first via post 201, a third line layer 3012, and a fourth line layer 3022 formed on the upper and lower surfaces of the groove 103 and electrically connected through the second via post 202, and a fifth line layer 702 formed on the first line layer 3011. A sixth line layer 803 may be formed on the fifth line layer 702, a solder resist layer may be formed on the sixth line layer 803 and balling may be implanted to form solder balls. Alternatively, a new line layer may continue to be formed on the sixth line layer 803, and solder balls may be formed on the new line layer. The solder balls allow the package structure to be solder connected as a whole. Since a plurality of line layers can be stacked on the fifth line layer 702, the design freedom of the package structure can be significantly improved.

The chip connection bridge 500 is embedded in the third line layer 3012 in the groove 103, and the chip connection bridge 500 may have a first pad 501 and the first pad 501 is connected with the third line layer 3012. At least two chips 901 may be mounted on the second line layer 3021 and the fourth line layer 3022, the terminals of the at least two chips 901 may each be connected with the second line layer 3021 and/or the fourth line layer 3022, for example, the terminals of the at least two chips 901 may be connected with a part of the fourth line layer 3022 and a part of the second line layer 3021, respectively, so that a chip connection bridge functions to interconnect the at least two chips 901 with each other. Here, it should be noted that the embodiment of the present application provides a case where two chips 901 are interconnected, and it is actually possible to set the number of chips as needed to realize the multi-chip interconnection of more than two chips.

The encapsulation structure further includes an encapsulation layer 601 covering the first line layer 3011 and the connection bridge 500, thereby encapsulating the connection bridge 500 in groove 103 of the glass carrier plate. The encapsulation layer 601 material may be selected from a thermosetting resin material or a photosensitive resin material. A fifth line layer 702 is provided on the encapsulation layer 601, and the fifth line layer 702 can be connected to the first line layer 3011 through a first blind hole 602 formed by opening a window on the encapsulation layer 601. When the connection bridge 500 has double-sided pads, for example, a second pad 502 on the opposite side of the first pad 501, the fifth line layer 702 may also connect the second pad 502 via the first blind hole 602.

In one embodiment, the pitch of the second via post 202 may be configured to be less than the pitch of the first via post 201, and the diameter of the second via post 202 may also be configured to be less than the diameter of the first via post 201 to accommodate denser and finer pads of the connection bridge 500 to meet the high-density I/O requirements of the connection bridge 500 for high-density routing of the package structure.

In one embodiment, connection bridge 500 includes a first pad 501 and an opposing second pad 502. The first pad 501 may be connected to the third line layer 3012 via the conductive adhesive 401 and the second pad 502 to the fifth line layer 702. The double-sided pad connection bridge 500 can realize more complicated chip interconnection functions. When attaching the connection bridge 500, the conductive adhesive 401 can fix the connection bridge 500, and at the same time can realize the electrical connection between the first pad 501 and the third line layer 3012.

Note that, in a practical case, the connection bridge 500 may have only a single-sided first pad 501 without providing the second pad 502.

In one embodiment, the second line layer 3021 is on the same plane as the fourth line layer 3022; The first line layer 3011 is on the same plane as the second pad 502. The second line layer 3021 and the fourth line layer 3022 are on the same plane to facilitate a post-flip chip 901; The first line layer 3011 is on the same plane as the second pad 502 to facilitate packaging of the connection bridge 500 and the first line layer 3011.

On the other hand, with reference to FIGS. 2A-2H, cross-sectional schematic views of intermediate structures of various steps of a method for manufacturing a chip 901 high-density interconnect package structure are shown.

Figures 2A, 2B:
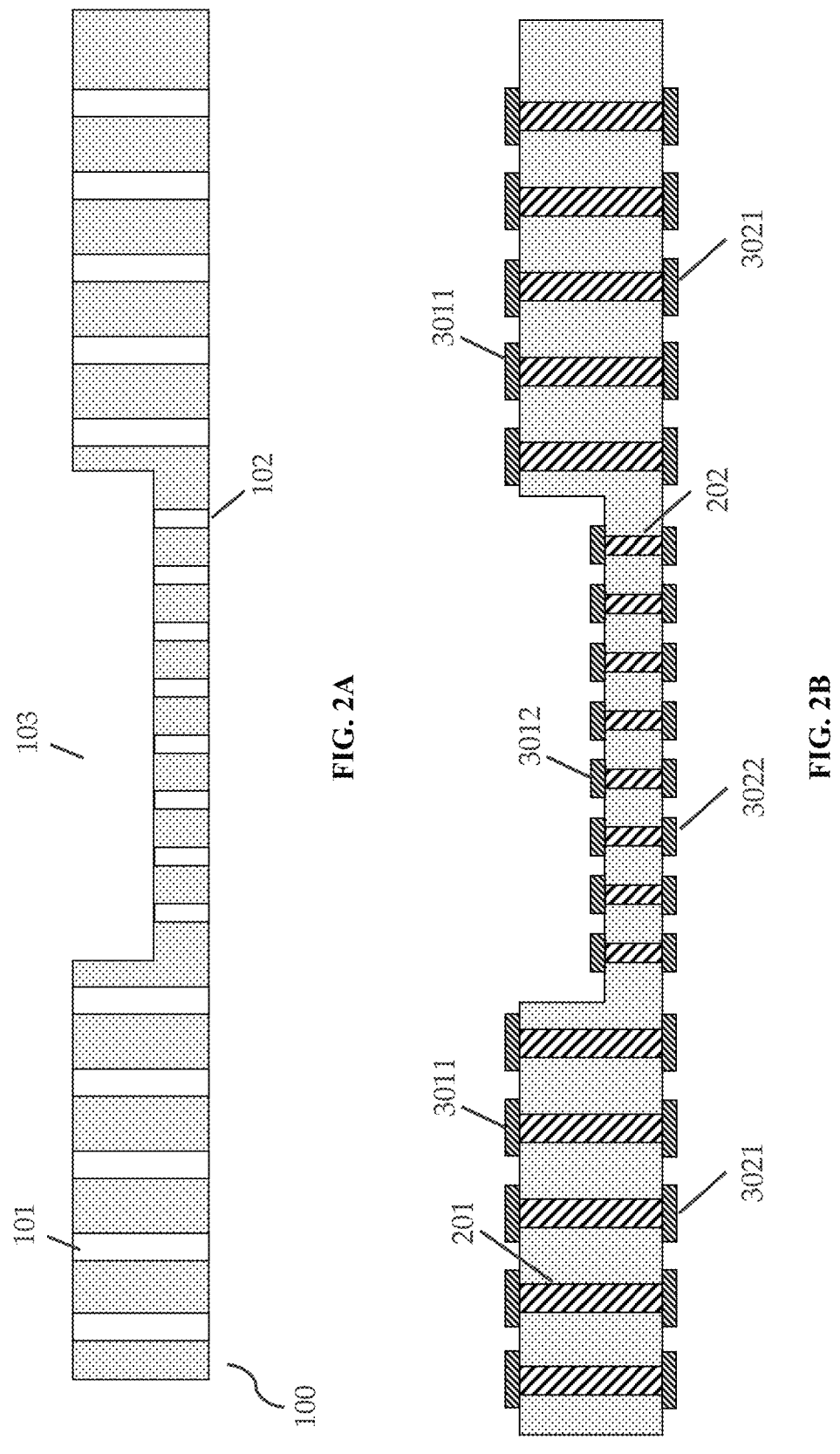
FIGS. 2A-2H are schematic cross-sectional views of intermediate structures at various steps of a method for manufacturing a chip high-density interconnection package structure according to one embodiment of the present application.

The manufacturing method includes the following steps: as shown in FIG. 2A, a glass carrier plate is provided, a groove 103 and a glass frame 100 surrounding the groove 103 are etched on the glass carrier plate, and a first via 101 and a second via 102 penetrating in the height direction are formed on the glass frame 100 and the groove 103, respectively. Then, the first via 101 and the second via 102 may be etched by laser-modifying the positions of the predetermined first via 101 and the second via 102, respectively. It should be noted that the pitch and diameter of the second via 102 may be made smaller than the pitch and diameter of the first via 101 in order to subsequently attach the high-density I/O on the connection bridge 500 for high-density wiring of the package structure.

Next, as shown in FIG. 2B, a first line layer 3011, a second line layer 3021, a third line layer 3012, and a fourth line layer 3022 are prepared. Generally, first forming a first via hole post 201 and a second via hole post 202 by electroplating in the first via hole and the second via hole, then preparing a metal seed layer on the upper surface and the lower surface of the glass carrier plate, applying a photoresist covering the third metal seed layer, performing photolithography on the photoresist, respectively electroplating a first line layer 3011, a second line layer 3021, a third line layer 3012 and a fourth line layer 3022 at positions corresponding to the photolithography area, then removing the photoresist, and etching the exposed metal seed layer; the first line layer 3011 and the second line layer 3021 are connected by a first via post 201, and the third line layer 3012 and the fourth line layer 3022 are connected by a second via post 202.

Figures 2C, 2D:
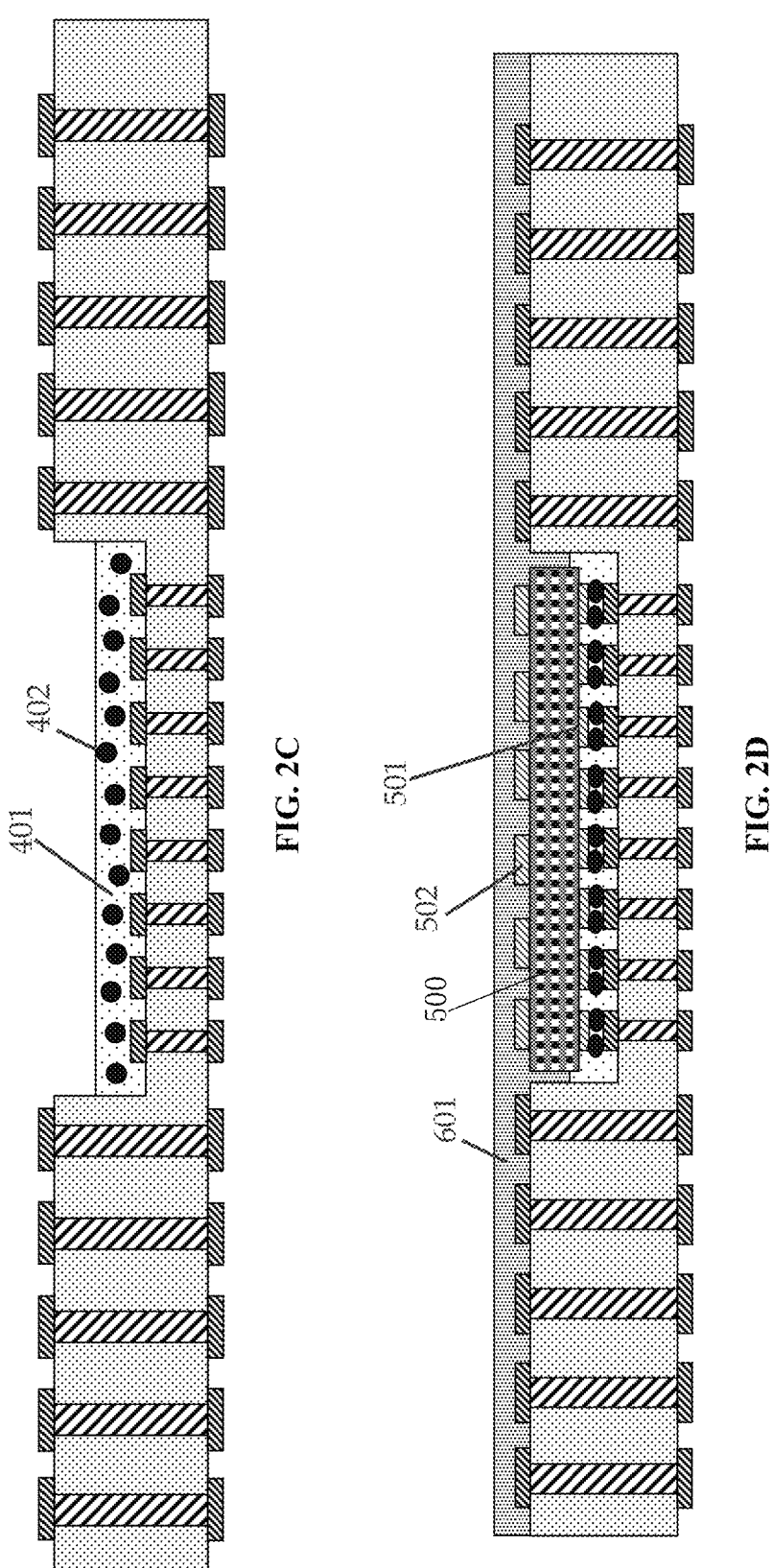

Next, a conductive adhesive 401 is applied in groove 103, as shown in FIG. 2C, the conductive adhesive 401 including conductive particles 402, the conductive adhesive 401 needs to cover the third line layer 3012.

Thereafter, the connection bridge 500 is attached to groove 103 via the conductive adhesive 401, as shown in FIG. 2D, so that the first pad 501 and the third line layer 3012 are correspondingly fixed to each other via the conductive adhesive 401, so as to realize the connection between the connection bridge 500 and the third line layer 3012. According to practical requirements, the connection bridge 500 may be a thin film line layer, a silicon intermediate layer, a glass intermediate layer, or a chip as long as it has a multi-chip interconnection function. The connection bridge 500 may have only one-sided pads, such as the first pad 501, or may have two-sided pads, such as the first pad 501 and the opposite second pad 502 in the present embodiment.

Next, the encapsulation layer 601 is laminated, as shown in FIG. 2D. After the encapsulation layer 601 is laminated, the encapsulation of the first line layer 3011 and the connection bridge 500 is completed, and at the same time, during the lamination of the encapsulation layer 601, the conductive particles 402 in the conductive adhesive 401 are compressed by the first pad 501 of the connection bridge 500 and the third line layer 3012, so as to realize the electrical connection between the connection bridge 500 and the third line layer 3012.

The encapsulation layer 601 may be a thermosetting resin material or a photosensitive resin material, and the first line layer 3011 and the connection bridge 500 are encapsulated while filling the gap between the connection bridge 500 and the groove 103.

Figures 2E, 2F:
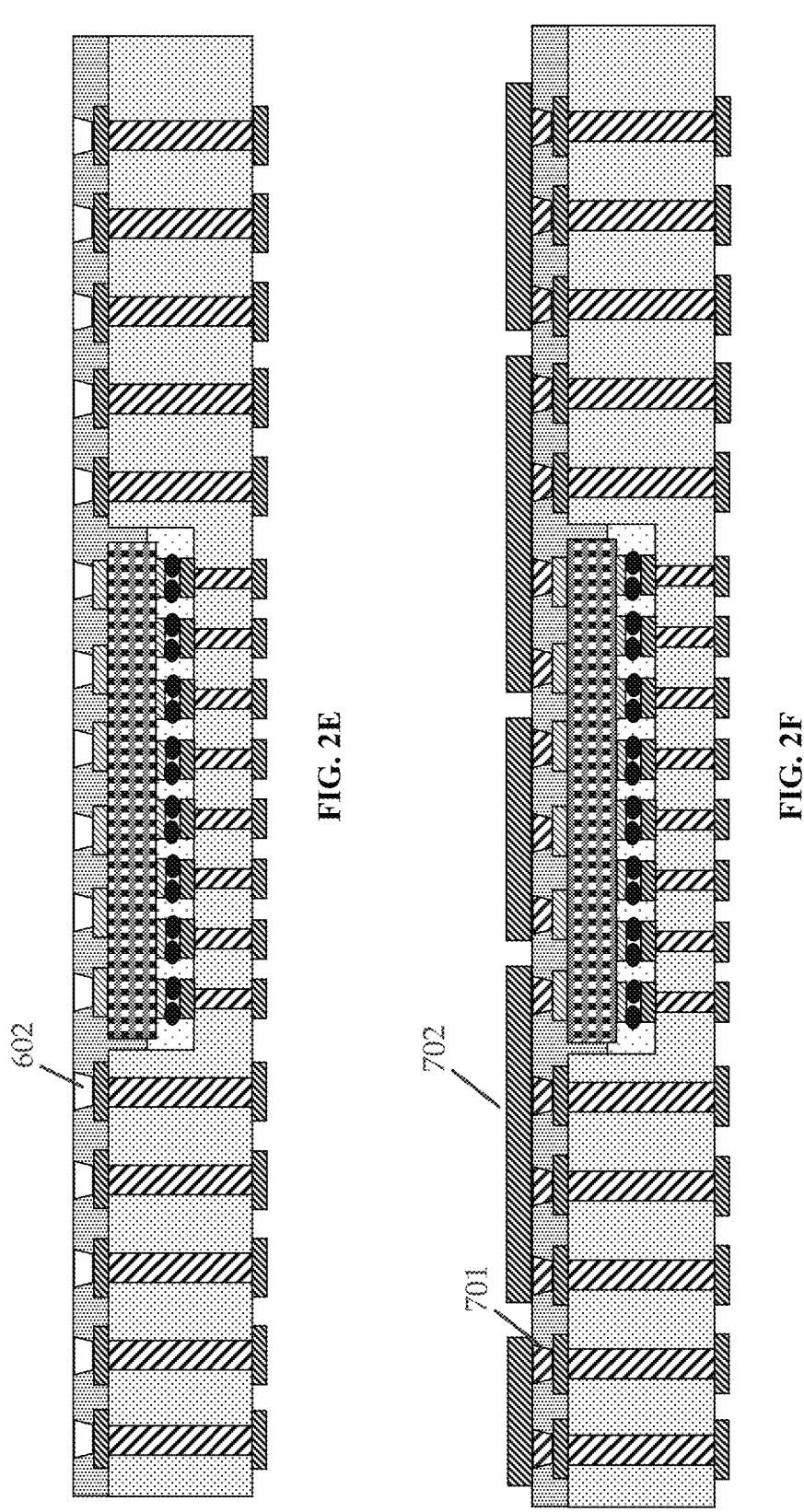

Next, the encapsulation layer 601 is windowed to form a first blind hole 602, as shown in FIG. 2E, the encapsulation layer 601 can be windowed by means of laser or exposure and development. The first blind hole 602 exposes the first line layer 3011 and the second pad 502 of the connection bridge 500.

Next, a fifth line layer 702 is formed on the encapsulation layer 601, as shown in FIG. 2F. First, a first metal seed layer 701 is prepared on the upper surface of the encapsulation layer 601 and in the first blind hole 602, then a line pattern of a fifth line layer 702 is made on the first metal seed layer 701, then the fifth line layer 702 is formed by electroplating on the line pattern, the exposed first metal seed layer 701 is etched away, and the connection of the fifth line layer 702 with the first line layer 3011 and the second pad 502 of the connection bridge 500 is completed.

Figure 2G:
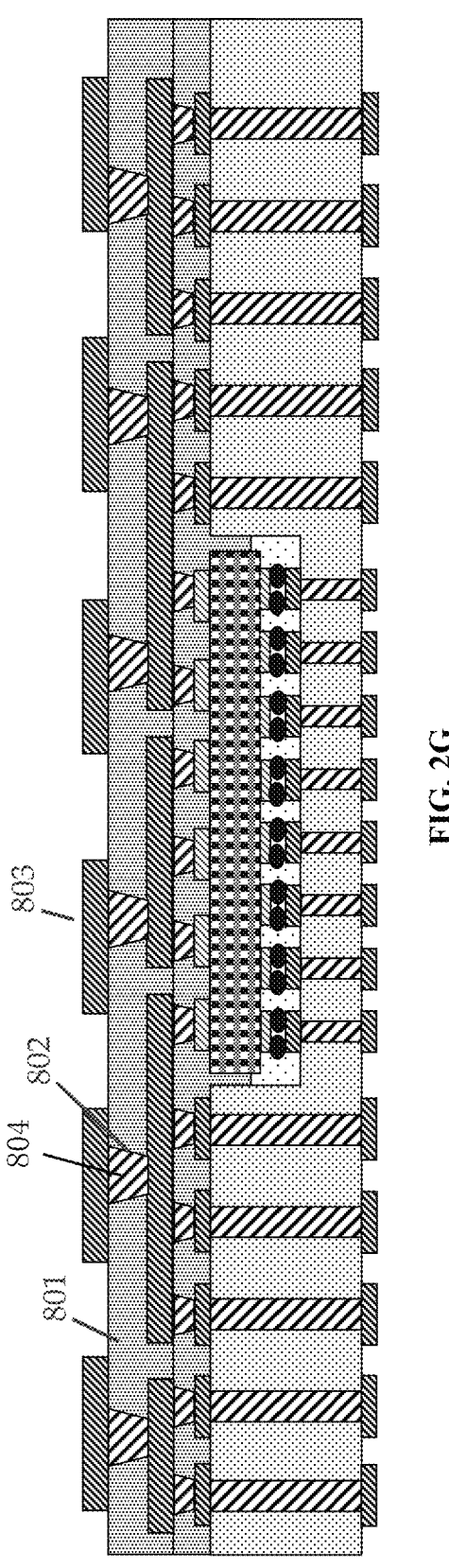

Next, an insulating layer 801 is laminated on the fifth line layer 702, and a sixth line layer 803 is formed on the insulating layer 801, as shown in FIG. 2G. Specifically, the insulating layer 801 may be laminated covering the fifth line layer 702, the insulating layer 801 is windowed to form a second blind hole 802, then a second metal seed layer 804 is prepared on the upper surface of the insulating layer 801 and in the second blind hole 802, then a wiring pattern of the sixth line layer 803 is made on the second metal seed layer 804, then the sixth line layer 803 is formed by electroplating on the wiring pattern, and the exposed second metal seed layer 804 is etched away so that the sixth line layer 803 is electrically connected to the fifth line layer 702.

It should be noted that additional insulating layers and line layers may be sequentially laminated to form the desired multilayer methods to form the desired multilayer packaging structure, as desired.

Figure 2H:
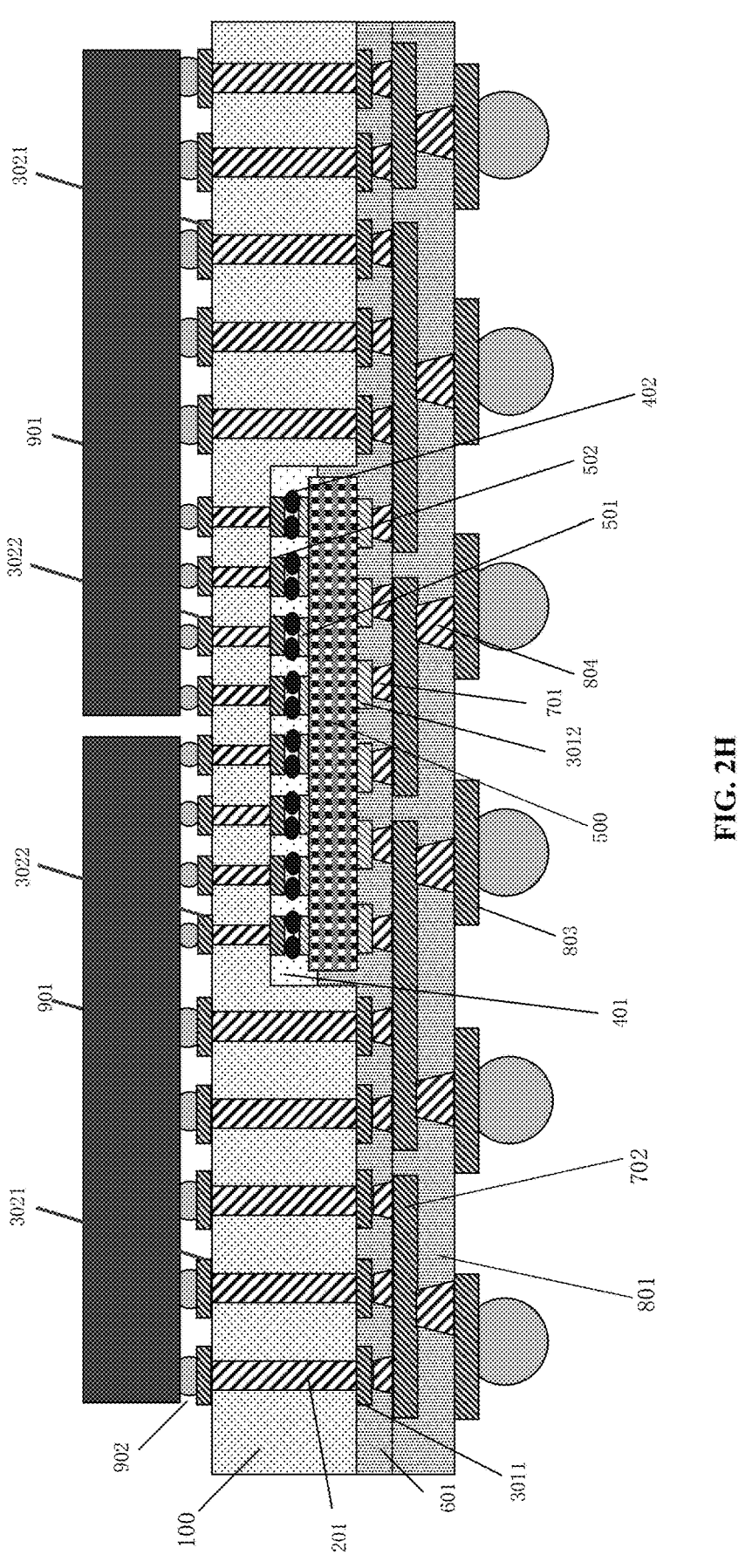

Thereafter, mounting of the chip 901 is performed, as shown in FIG. 2H. After the processing of the solder resist layer and the metal surface treatment are performed on both sides of the above-mentioned packaging structure to form the solder resist windows, solder balls 902 are prepared on the second line layer 3021 and the fourth line layer 3022 by a balling method, and then the chips 901 are flipped, wherein the terminals of one chip 901 can be connected to a part of the second line layer 3021 and a part of the fourth line layer 3022 respectively via the solder balls 902, and the terminals of the other chip 901 are connected to a part of the second line layer 3021 and a part of the fourth line layer 3022 respectively via the solder balls 902, so as to realize the interconnection of the two chips 901. It is also possible to mount a plurality of chips 901 such that their respective terminals are connected to a part of the second line layer 3021 and a part of the fourth line layer 3022 through solder balls 902, respectively, as necessary to realize the interconnection between the plurality of chips 901.

Finally, balling may be performed on the solder mask of the sixth line layer 803 to form solder balls that electrically connect the package structure to the outside world. Thus, forming an integral package in which a multi-chip is interconnected by a connection bridge embedded in a glass carrier plate can not only significantly reduce the volume of the integral package structure, but also improve the design freedom of the multi-chip package structure, and at the same time can improve the reliability of the multi-chip package and meet the requirements of high-density I/O of the chip connection bridge.

Those of ordinary skill in the art will appreciate that The discussion of any embodiment above is merely exemplary and is not intended to imply that the scope of the application, including the claims, is limited to these examples; combinations of features in the above embodiments or different embodiments are also possible within the framework of the present application, the steps can be implemented in any order, and there are many other variations of the different aspects of the embodiments of the present application described above, which are not provided in detail for the sake of brevity.

While this application has been described in conjunction with specific embodiments thereof, it is evident that many alternatives, modifications, and variations will be apparent to those skilled in the art in light of the foregoing description.

The present embodiments are intended to embrace all such alternatives, modifications, and variances which fall within the broad scope of the appended claims. Accordingly, it is intended that the present invention cover the modifications and variations of this invention provided they come within the scope of the appended claims and their equivalents.

What is claimed is:

1. A chip high-density interconnection package structure comprising:
   a glass carrier plate having a glass groove, wherein the glass groove has a certain glass thickness and formed by locally and incompletely etching the glass carrier plate in a height direction;
   a glass frame surrounding the glass groove, wherein the glass thickness of the glass groove is less than the glass thickness of the glass frame;
   a first via post penetrating the glass frame;
   a second via post penetrating the glass groove;
   a first line layer and a second line layer formed on the upper and lower surfaces of the glass frame and electrically connected via the first via post;
   a third line layer and a fourth line layer formed on the upper and lower surfaces of the groove and electrically connected via the second via post;
   a chip connection bridge mounted on the third line layer in the groove;
   a fifth line layer formed on the first line layer; and
   at least two chips mounted on the second line layer and the fourth line layer,
   wherein the chip connection bridge has a first pad, and the first pad is connected to the third line layer, the terminals of the two chips are each connected to the fourth line layer and/or the second line layer, and the fifth line layer is connected to the first line layer.

2. The chip high-density interconnection package structure of claim 1, wherein the chip connection bridge further has a second pad on an opposite surface of the first pad, wherein the second pad is connected to the fifth line layer.

3. The chip high-density interconnection package structure of claim 1 further comprising an encapsulation layer covering the first line layer and the connection bridge.

4. The chip high-density interconnection package structure of claim 1 further comprising an insulating layer on the fifth line layer and a sixth line layer on the insulating layer.

5. The chip high-density interconnection package structure of claim 1, wherein the pitch of the first via posts is greater than the pitch of the second via posts.

6. The chip high-density interconnection package structure of claim 1, wherein the first pad of the connection bridge is connected to the third line layer by a conductive adhesive.

7. The chip high-density interconnection package structure of claim 2, wherein the second line layer is on the same plane as the fourth line layer; the first line layer is on the same plane as the second pad.

8. The chip high-density interconnection package structure of claim 1, wherein the at least two chips comprise a first chip and a second chip, wherein terminals of the first chip and the second chip are connected to a part of the second line layer and a part of the fourth line layer, respectively, so that the chip connection bridge functions to connect the first chip and the second chip.

9. A method for manufacturing a chip high-density interconnection package structure, the method comprising:
   locally and incompletely etching a glass carrier plate to form a glass groove and a glass frame surrounding the glass groove in a height direction, and forming a first via and a second via penetrating in a height direction on the glass frame and the glass groove;
   metalizing the glass carrier plate, forming a first line layer and a second line layer on the upper and lower surfaces of the glass frame, forming a third line layer and a fourth line layer on the upper and lower surfaces of the glass groove, filling the first via to form a first via post, filling the second via to form a second via post, so that the first via post is conductively connected to the first line layer and the second line layer, and the second via post is conductively connected to the third line layer and the fourth line layer;
   attaching a chip connection bridge in the glass groove so that a first pad of the chip connection bridge is connected to the third line layer;
   laminating an encapsulation layer so that the encapsulation layer covers the first line layer and the chip connection bridge;
   forming a fifth line layer on the encapsulation layer so that the first line layer is connected to the fifth line layer;
   forming an insulating layer on the fifth line layer, and forming a sixth line layer on the insulating layer, so that the fifth line layer is connected to the sixth line layer; and
   flip-mounting at least two chips on the second line layer and the fourth line layer,
   wherein the at least two chips comprise a first chip and a second chip,
   wherein terminals of the first chip and the second chip are connected to a part of the second line layer and a part of the fourth line layer, respectively, so that the chip connection bridge functions to connect the first chip and the second chip.

10. The method of claim 9, wherein the first pad of the chip connection bridge and the third line layer are fixed by a conductive adhesive connection.

11. The method of claim 9, wherein the chip connection bridge further has a second pad on an opposite surface of the first pad, wherein the second pad is connected to the fifth line layer.

12. The method of claim 9, further comprising balling on the sixth line layer to form solder balls that lead through the at least two chips.

* * * * *